US008284622B2

(12) United States Patent
Evans et al.

(10) Patent No.: US 8,284,622 B2
(45) Date of Patent: Oct. 9, 2012

(54) MEMORY DEVICE WITH PHASE DISTRIBUTION CIRCUIT FOR CONTROLLING RELATIVE DURATIONS OF PRECHARGE AND ACTIVE PHASES

(75) Inventors: Donald Albert Evans, Carroll, OH (US); Richard J. McPartland, Nazareth, PA (US); Hai Quang Pham, Hatfield, PA (US); Wayne E. Werner, Coopersburg, PA (US); Ronald James Wozniak, Whitehall, PA (US)

(73) Assignee: LSI Corporation, Milpitas, CA (US)

( * ) Notice: Subject to any disclaimer, the term of this patent is extended or adjusted under 35 U.S.C. 154(b) by 192 days.

(21) Appl. No.: 12/893,153

(22) Filed: Sep. 29, 2010

(65) Prior Publication Data

US 2012/0075946 A1 Mar. 29, 2012

(51) Int. Cl.
*G11C 7/00* (2006.01)
(52) U.S. Cl. .................................. 365/203; 365/189.011
(58) Field of Classification Search .................. 365/203, 365/189.011
See application file for complete search history.

(56) References Cited

U.S. PATENT DOCUMENTS

| 6,005,793 | A | 12/1999 | Tran |
| 6,510,091 | B1 | 1/2003 | Braceras et al. |
| 7,239,565 | B2 * | 7/2007 | Liu ................................ 365/203 |
| 7,504,864 | B2 | 3/2009 | Murillo et al. |
| 7,633,830 | B2 | 12/2009 | Evans et al. |
| 7,646,658 | B2 | 1/2010 | Chen et al. |
| 2010/0220534 | A1 | 9/2010 | Dudeck et al. |

FOREIGN PATENT DOCUMENTS

WO 2008/133678 A1 11/2008

* cited by examiner

*Primary Examiner* — Son Dinh
*Assistant Examiner* — Nam Nguyen
(74) *Attorney, Agent, or Firm* — Ryan, Mason & Lewis, LLP

(57) ABSTRACT

A memory device comprises a memory array and a phase distribution circuit coupled to the memory array. In one aspect, the phase distribution circuit is operative to control respective durations of a precharge phase and an active phase of a memory cycle of the memory array based on relative transistor characteristics of a tracked precharge transistor of a first conductivity type and a tracked memory cell transistor of a second conductivity type different than the first conductivity type. For example, the phase distribution circuit may comprise a first tracking transistor of the first conductivity type for tracking the precharge transistor of the first conductivity type and a second tracking transistor of the second conductivity type for tracking the memory cell transistor of the second conductivity type. The relative transistor characteristics may comprise relative strengths of the tracked precharge and memory cell transistors.

20 Claims, 3 Drawing Sheets

MEMORY DEVICE WITH PHASE DISTRIBUTION CIRCUIT FOR CONTROLLING RELATIVE DURATIONS OF PRECHARGE AND ACTIVE PHASES

FIELD OF THE INVENTION

The present invention relates generally to semiconductor memory devices, and more particularly to techniques for controlling precharge and active phases of a memory cycle in such devices.

BACKGROUND OF THE INVENTION

A semiconductor memory device typically includes an array of memory cells arranged in rows and columns, with each memory cell configured to store one or more bits of data. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into a precharge phase and an active phase, with the precharge phase being used to precharge the bitlines to a precharge voltage, and the active phase being used to read or write one or more memory cells of the array. Reading a given memory cell generally comprises transferring data stored within that cell to its corresponding bitline, and writing a given memory cell generally comprises transferring data into that cell from its corresponding bitline.

The speed of data transfer from the memory cells to the bitlines during a read operation, or from the bitlines to the memory cells during a write operation, is often dependent upon the gain or other characteristics of a memory cell transistor. This is typically the case, for example, in dynamic random access memory (DRAM), Flash memory, and read-only memory (ROM). In many implementations, the cell transistor may be an n-channel transistor, while the associated precharge circuitry comprises one or more p-channel precharge transistors. This can create a problem, in that the relative strengths of the n-channel cell transistors and the p-channel precharge transistors may differ due to process conditions, leading to variations in the durations of the precharge and active phases of the memory cycle. However, the memory device generally must have a memory cycle of predetermined length, usually determined by one or more of the capability of the memory and the application of the memory.

In conventional practice, the predetermined length of the memory cycle is set so as to be long enough to accommodate both the worst case precharge phase duration and the worst case active phase duration, even though the worst case precharge phase duration and the worst case active phase duration typically occur under different process conditions. In the above-noted example involving n-channel cell transistors and p-channel precharge transistors, the worst case or longest precharge phase duration occurs under process conditions yielding relatively weak p-channel transistors, and the worst case or longest active phase duration occurs under process conditions yielding relatively weak n-channel transistors. As a result, the memory cycle length is unduly increased, which can lead to higher power consumption in the memory device. The power supply operating range and manufacturing yield can also be adversely impacted.

It is therefore apparent that a need exists for an improved approach to controlling the respective durations of precharge and active phases of a memory cycle of a memory device in the presence of process variations.

SUMMARY OF THE INVENTION

The present invention in one or more illustrative embodiments provides techniques for controlling the respective durations of precharge and active phases of a memory cycle using a phase distribution circuit. These embodiments advantageously provide a shorter memory cycle than would otherwise be possible, by avoiding the need to lengthen the memory cycle to accommodate both the worst case precharge phase duration and the worst case active phase duration. The shorter memory cycle can reduce power consumption in the memory device, while also potentially improving power supply operating range and manufacturing yield.

In accordance with one aspect of the invention, a memory device comprises a memory array and a phase distribution circuit coupled to the memory array. The phase distribution circuit is operative to control respective durations of a precharge phase and an active phase of a memory cycle of the memory array based on relative transistor characteristics of a tracked precharge transistor of a first conductivity type and a tracked memory cell transistor of a second conductivity type different than the first conductivity type. The relative transistor characteristics may comprise relative strengths of the tracked precharge and memory cell transistors.

In an illustrative embodiment, the phase distribution circuit may comprise a first tracking transistor of the first conductivity type for tracking the precharge transistor of the first conductivity type and a second tracking transistor of the second conductivity type for tracking the memory cell transistor of the second conductivity type. The phase distribution circuit in this embodiment further comprises first and second inverters, with an output of the first inverter coupled to an input of the second inverter. The first and second tracking transistors have their gate terminals coupled to an output of the second inverter and their source or drain terminals coupled to the output of the first inverter, such that the first tracking transistor is operative to oppose a signal transition in a first direction at the output of the first inverter and the second tracking transistor is operative to oppose a signal transition in a second direction at the output of the first inverter.

In the above-described illustrative embodiment, if the tracked precharge transistor and the tracked memory cell transistor have a particular predetermined strength ratio, the phase distribution circuit controls the durations of the precharge and active phases of the memory cycle such that said durations have a corresponding predetermined ratio.

By way of example, if the tracked precharge transistor is stronger than the tracked memory cell transistor, the phase distribution circuit controls the durations of the precharge and active phases of the memory cycle such that the duration of the precharge phase is shorter than the duration of the active phase. Similarly, if the tracked precharge transistor is weaker than the tracked memory cell transistor, the phase distribution circuit controls the durations of the precharge and active phases of the memory cycle such that the duration of the precharge phase is longer than the duration of the active phase.

A memory device in accordance with the invention may be implemented, for example, as a stand-alone memory device, such as a packaged integrated circuit, or as an embedded memory in a microprocessor or other processing device.

DETAILED DESCRIPTION OF THE INVENTION

The invention will be illustrated herein in conjunction with exemplary semiconductor memory devices and associated phase distribution circuits as well as other related circuitry. It should be understood, however, that the invention is more generally applicable to any semiconductor memory device, and may be implemented using circuitry other than that specifically shown in conjunction with the illustrative embodiments.

Figure 1:
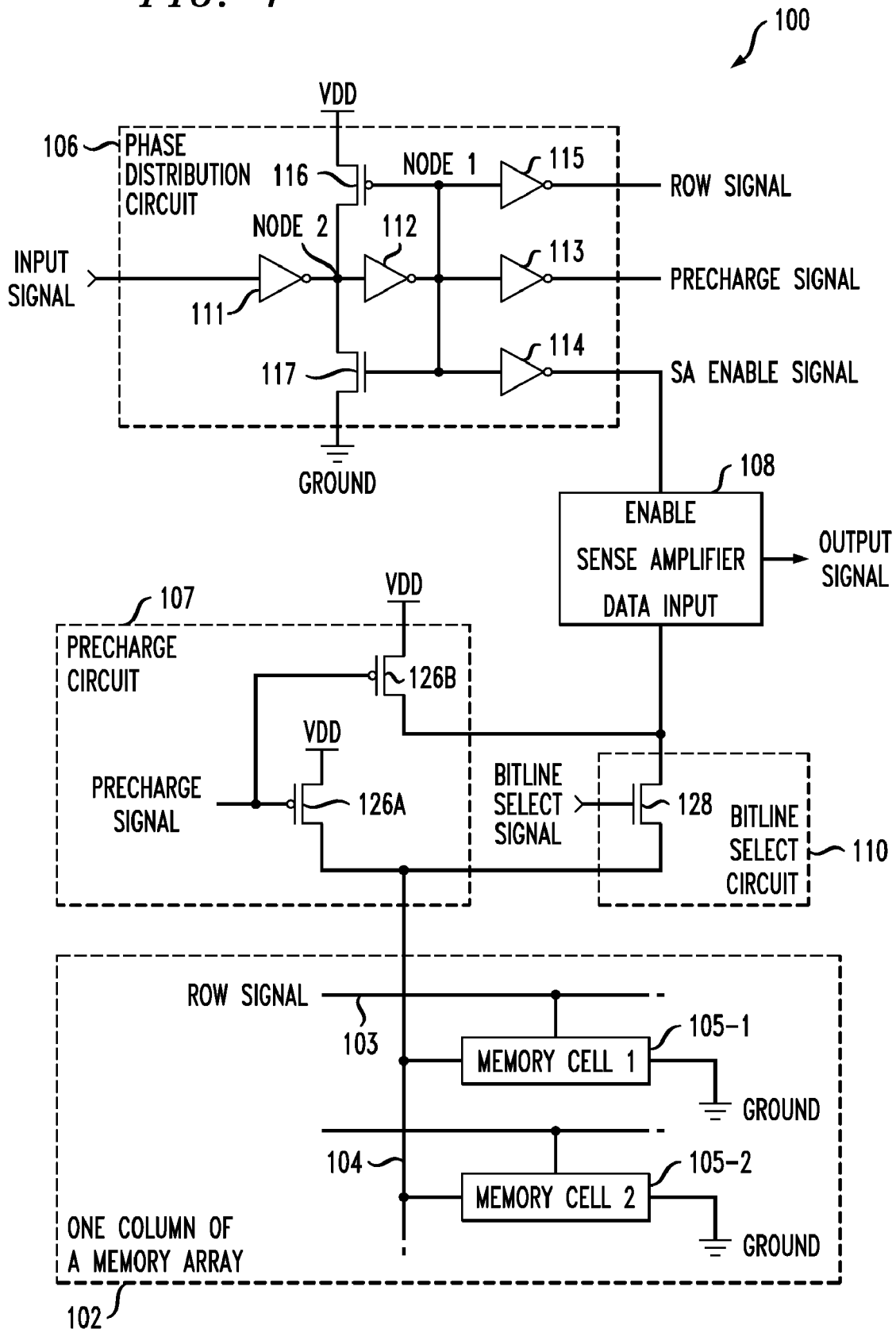
FIG. 1 is a schematic diagram of a semiconductor memory device with a phase distribution circuit in an illustrative embodiment of the invention.

FIG. 1 shows a memory device 100 in accordance with an illustrative embodiment of the invention. The memory device 100 comprises a memory array 102 having a plurality of memory cells 105 configured to store data. The memory cells 105 may each be configured to store a single bit of data, although other types of cells may be used in other embodiments. Each memory cell in a given row of the memory array is coupled to a corresponding wordline 103 and each cell in a given column is coupled to a corresponding bitline 104. The array therefore includes a memory cell at each point where a wordline intersects with a bitline. The portion of the memory array 102 explicitly shown in the figure includes only two memory cells 105-1 and 105-2, arranged in a single column and in respective adjacent rows, but it is to be understood that the memory array may more generally comprise memory cells arranged in $2^N$ columns and $2^M$ rows. The particular values selected for N and M will vary depending upon on the needs of the application in which the memory device is utilized.

It should be noted that the memory device 100 may be implemented using a wide variety of different types of stand-alone or embedded memory, including static or dynamic random access memory (SRAM or DRAM), electrically erasable programmable ROM (EEPROM), Flash memory, magnetic RAM (MRAM), ferroelectric RAM (FRAM), phase-change memory (PCRAM), etc. Also, as indicated previously, other types of memory cell configurations may be used. For example, the memory cells in the array 102 could be multi-level cells each configured to store more than one bit of data. The invention is thus not limited in terms of the particular storage or access mechanism utilized in the memory device 100.

The memory device 100 in the present embodiment also includes a phase distribution circuit 106, a precharge circuit 107, a sense amplifier 108 and a bitline select circuit 110. The phase distribution circuit comprises inverters 111, 112, 113, 114 and 115, a p-channel tracking transistor 116 and an n-channel tracking transistor 117. An input signal, illustratively shown at the top of the FIG. 2 timing diagram, is applied to the input of the first inverter 111, and the output of the first inverter drives the input of the second inverter 112. The output of the second inverter, also denoted Node 1, is coupled to the respective gates of the p-channel and n-channel tracking transistors 116 and 117, and to the inputs of the inverters 113, 114 and 115. The FIG. 2 timing diagram also shows the Node 1 signal under various relative strength conditions of the precharge and memory cell transistors, as will be described in greater detail below.

Figure 3:
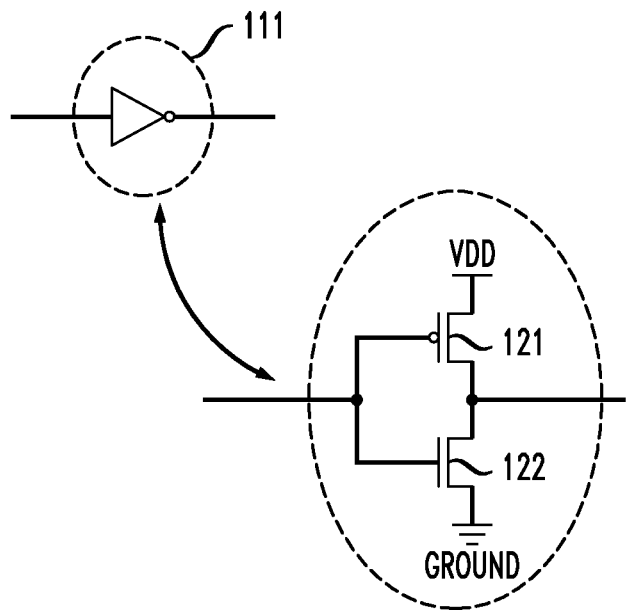
FIGS. 3 and 4 illustrate exemplary implementations of inverter and memory cell circuitry in the memory device of FIG. 1.

FIG. 3 shows the configuration of inverter 111 of the phase distribution circuit 106. The other inverters 112, 113, 114 and 115 are configured in substantially the same manner. Each such inverter includes a p-channel transistor 121 and an n-channel transistor 122, with the gates of the two transistors being coupled together and forming the inverter input, and the drains of the two transistors being coupled together and forming the inverter output.

Figure 4:
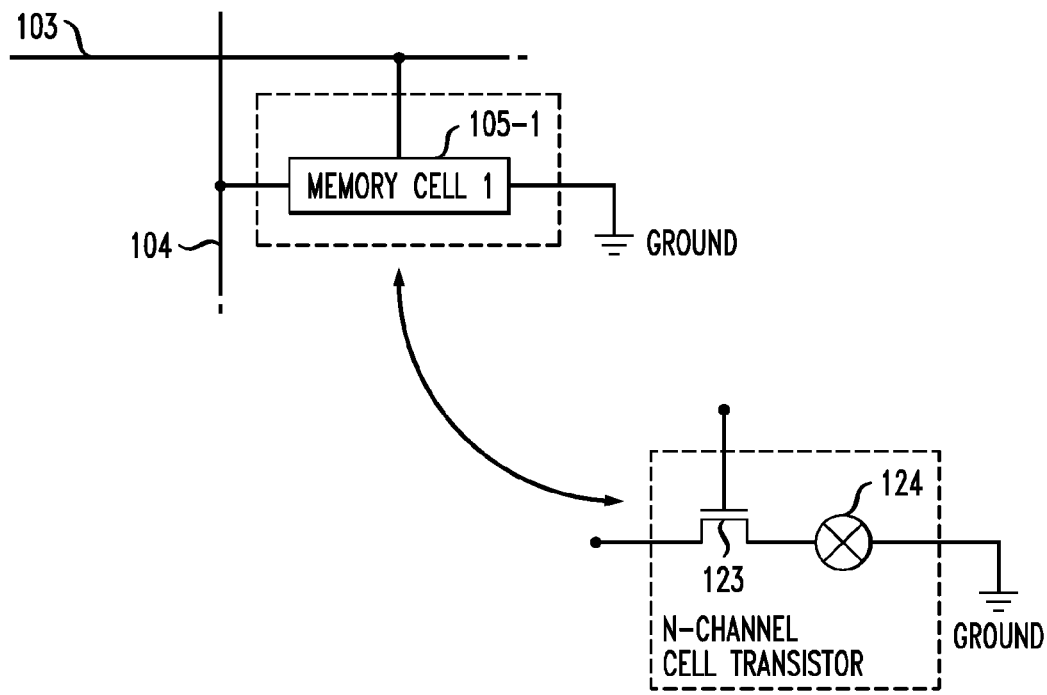

FIG. 4 shows the configuration of the memory cell 105-1 of the memory array 102. The memory cell in this embodiment is in the form of a ROM cell that includes an n-channel cell transistor 123 having its source coupled to ground via circuit element 124. The gate and drain of the n-channel cell transistor 123 are coupled to the wordline 103 and the bitline 104, respectively. Memory cell 105-2, and the other cells of the memory array, are each configured in substantially the same manner as memory cell 105-1. Although these cells are assumed to be ROM cells in the present embodiment, other types of cells can be used, including SRAM or DRAM cells, Flash memory cells, MRAM, FRAM or PC-RAM memory cells, etc. The particular manner in which such cells operate to allow reading and writing of data is well-understood by those skilled in the art, and therefore not further described herein.

Returning now to FIG. 1, the output of inverter 111, also denoted Node 2, in addition to driving the input of the second inverter 112 as mentioned previously, is coupled to respective drain terminals of the p-channel and n-channel tracking transistors 116 and 117. Source terminals of the p-channel and n-channel tracking transistors 116 and 117 are coupled to supply voltage VDD and ground, respectively.

The outputs of the inverters 113, 114 and 115 of the phase distribution circuit 106 provide precharge, sense amplifier (SA) enable and row signals to the precharge circuit 107, sense amplifier 108 and wordline 103, respectively. The precharge signal from inverter 113 is applied to the gates of p-channel precharge transistors 126A and 126B of the precharge circuit 107. The SA enable signal from inverter 114 is applied to an enable input of the sense amplifier 108. A bitline select signal is applied to an input of the bitline select circuit 110. Drain terminals of the p-channel precharge transistors 126A and 126B of the precharge circuit 107 are coupled to the bitline 104 and a data input of the sense amplifier 108, respectively. The drain terminals of the p-channel precharge transistors 126A and 126B are also coupled to respective source and drain terminals of an n-channel transistor 128 of the bitline select circuit 110.

It should be noted that, although memory array 102 is identified in FIG. 1 as comprising the cells 105 and their associated wordlines and bitlines 103 and 104, the term "memory array" as used herein is intended to be broadly construed, and therefore in a given embodiment may encompass one or more associated circuitry elements such as precharge circuit 107, sense amplifier 108 and bitline select circuit 110. Thus, elements such as 107, 108 and 110 in the FIG. 1 arrangement may be considered part of the memory array.

In the memory device 100, the relative strength of the p-channel tracking transistor 116 of the phase distribution circuit 106 tracks the relative strength of the p-channel precharge transistors in the precharge circuit 107. Similarly, the relative strength of the n-channel tracking transistor 117 of the phase distribution circuit 106 tracks the relative strength of the n-channel cell transistors 123 in the memory cells 105.

The relative strength of a transistor in the present embodiment may be based on the gain of the transistor. Thus, a strong transistor may be a transistor with a relatively high gain, for example, a gain higher than a nominal gain. Conversely, a transistor with a relatively low gain, for example, a gain lower than the nominal gain, may be referred to herein as a weak transistor. Other definitions of strong and weak transistors are also possible, for example, relatively low threshold or high transconductance transistors may be termed strong transistors and relatively high threshold or low transconductance transistors may be termed weak transistors. Typically, there are integrated circuit process conditions that result in skewed n-channel transistor and p-channel transistor characteristics, for example, strong n-channel transistors and weak p-channel transistors, or weak n-channel transistors and strong p-channel transistors.

As mentioned above, such skewing of the relative strengths of the n-channel cell transistors and the p-channel precharge transistors in a conventional memory device can lead to variations in the durations of the precharge and active phases of the memory cycle, causing the memory cycle to be unduly lengthened.

More specifically, in a conventional memory device, the weaker the p-channel precharge transistors, the more time it takes to precharge the bitline and the sense amplifier data input node, and conversely the stronger the p-channel precharge transistors, the less time it takes to precharge the bitline and the sense amplifier data input node. Also, during reading, the weaker the n-channel cell transistors, the more time it takes to develop data signal on the bitlines (i.e., to transfer data from the cell to the bitline), and conversely the stronger the n-channel cell transistors, the less time it takes to develop data signal on the bitlines. Furthermore, during writing, the weaker the n-channel cell transistors, the more time it takes to transfer signal from the bitlines through the cell transistor into the cell, and conversely the stronger the n-channel cell transistors, the less time it takes to transfer signal from the bitlines through the cell transistor into the cell.

Accordingly, the durations of the precharge and active phases of the memory cycle are influenced by the relative strengths of the p-channel precharge transistors and the n-channel cell transistors. Conventional practice, as previously described, is to make the memory cycle long enough to accommodate both the worst case precharge phase duration and the worst case active phase duration, even though the worst case precharge phase and the worst case active phase typically occur under different process conditions. That is, the worst case precharge phase occurs with process conditions yielding weak p-channel transistors, and the worst case active phase occurs with process conditions yielding weak n-channel transistors. However, increasing the length of the memory cycle to accommodate such variations can lead to problems such as higher power consumption, lower power supply operating range and lower manufacturing yield.

The present embodiment of memory device 100 is advantageously configured to avoid the above-noted drawbacks of conventional practice through the use of phase distribution circuit 106, which as previously noted includes p-channel tracking transistor 116 and n-channel tracking transistor 117. As will be described below in conjunction with the timing diagram of FIG. 2, the phase distribution circuit 106 is configured to compensate for skew in the relative strengths of the n-channel cell transistors and the p-channel precharge transistors.

Figure 2:
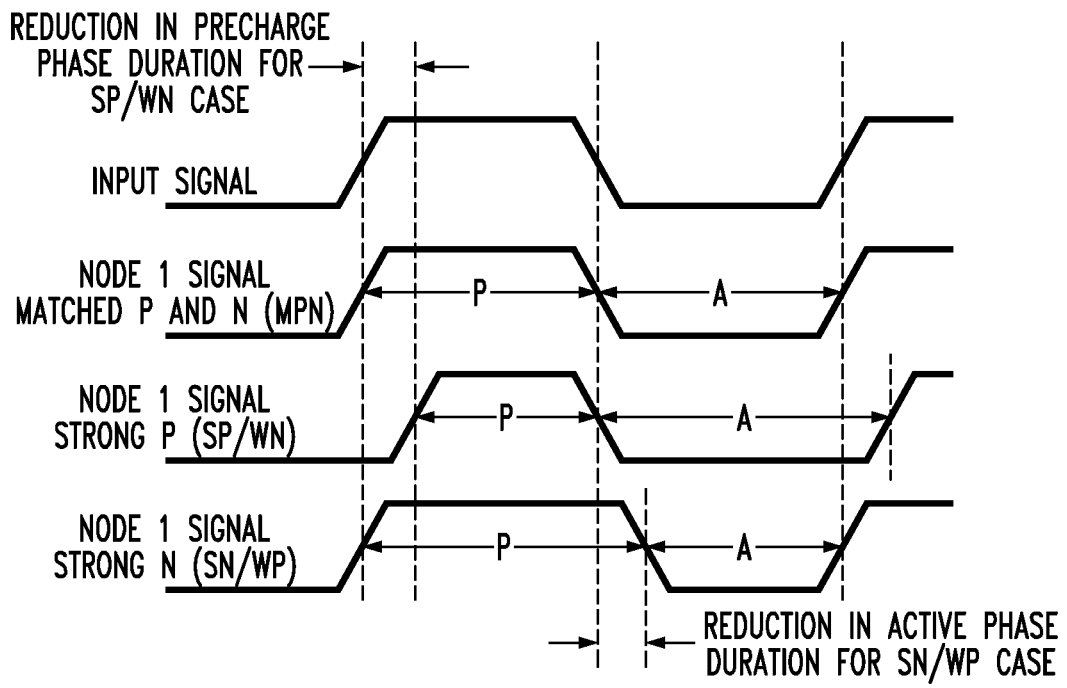
FIG. 2 is a timing diagram illustrating the operation of the phase distribution circuit in the memory device of FIG. 1.

In the FIG. 2 timing diagram, waveforms are shown for an input signal applied to the input of the phase distribution circuit 106 as well for the corresponding Node 1 tracking signal under three different relative strengths of the p-channel tracking transistor 116 and the n-channel tracking transistor 117. More particularly, FIG. 2 illustrates the differences in the time durations of the precharge phase and of the active phase of the memory cycle as a function of the relative strengths of the p-channel tracking transistor 116 and the n-channel tracking transistor 117. It should be noted that FIG. 2 does not show any delay time of the Node 1 signal relative to the input signal that may be introduced by the first inverter 111 and the second inverter 112. The input signal in this example is shown as having equal high and low times. The precharge phase corresponds to a first portion of the Node 1 signal that is high and is indicated in FIG. 2 by the arrowed line labeled "P." The active phase corresponds to a second portion of the Node 1 signal that is low and is indicated in FIG. 2 by the arrowed line labeled "A."

The three different cases of relative transistor strength illustrated in FIG. 2 include a matched p and n (MPN) case in which the relative strengths of the p-channel tracking transistor 116 and the n-channel tracking transistor 117 are approximately matched, a strong p and weak n (SP/WN) case in which the p-channel tracking transistor 116 is relatively strong with respect to the n-channel tracking transistor 117, or the n-channel tracking transistor 117 is relatively weak with respect to the p-channel tracking transistor 116, and a strong n and weak p (SN/WP) case in which the n-channel tracking transistor 117 is relatively strong with respect to the p-channel tracking transistor 116, or the p-channel tracking transistor 116 is relatively weak with respect to the n-channel tracking transistor 117.

In the MPN case shown in FIG. 2, the p-channel and n-channel transistors are of approximately equal strength, and the phase durations of the precharge and active phases remain similar to the corresponding portions of the input signal and are approximately equal. It should be noted that this is by way of illustrative example only. In many practical applications, the precharge phase and the active phase will not be equal in duration. This is because the precharge phase is controlled by p-channel transistors that can usually be made much larger than the n-channel devices that are used in the memory cells. Therefore, the phases in the MPN case may instead be proportioned for adequate precharge and active completion for a typical p-channel transistor to n-channel transistor strength ratio. For example, in the MPN case, the precharge phase may be 40% of the overall cycle time, while the active phase may be 60%. The phase distribution circuit 106 would then be configured to adjust around that 40/60 ratio. Thus, the baseline MPN case in these and other embodiments need not have precharge and active phases of equal duration. The strength ratio is inversely proportional to the phase duration ratio, as stronger precharge transistors would require a shorter precharge phase duration.

In the SP/WN case, the duration of the active phase is increased and the duration of the precharge phase is reduced. When the input signal is low, Node 2 is consequently high and Node 1 is consequently low so that the p-channel tracking transistor 116 is in the on or conductive state. Current through the on p-channel tracking transistor 116 opposes the pull-down of Node 2 by the n-channel transistor 122 in the first inverter 111 shown in FIG. 3. Consequently, the high to low transition of the Node 2 signal is delayed and/or prolonged. Because the Node 1 signal is the inverse of the Node 2 signal, the low to high transition of the Node 1 signal is delayed and/or prolonged as shown in FIG. 2.

As a result of the increase in the duration of the active phase in the SP/WN case, during reading there is more time for signal development on the bitlines 104 for signal stored in the cells 105 and propagating from the cells to the bitlines through the relatively weak n-channel cell transistors 123. During writing, there is also more time for signal to propagate from the bitlines through the cell transistors into the cells for storage. Because the p-channel precharge transistors 126 are relatively strong, less time is needed for precharge and the shorter duration of the precharge phase is acceptable and advantageous since less power is required for maintaining the precharge on the precharged bitlines and on the sense amplifier input node.

In the SN/WP case, the duration of the precharge phase is increased and the duration of the active phase is reduced. When the input signal is high, Node 2 is consequently low and Node 1 is consequently high so that the n-channel tracking transistor 117 is in the on or conductive state. Current through the on n-channel tracking transistor 117 opposes the pullup of Node 2 by the p-channel transistor 121 in the first inverter 111 shown in FIG. 3. Consequently, the low to high transition of the Node 2 signal is delayed and/or prolonged. Because the Node 1 signal is the inverse of the Node 2 signal, the high to low transition of the Node 1 signal is delayed and/or prolonged as shown in FIG. 2.

As a result of the increase in the duration of the precharge phase in the SN/WP case, there is more time for precharging the bitlines 104 and the sense amplifier data input nodes through the relatively weak p-channel precharge transistors 126. Because the n-channel cell transistors 123 are relatively strong, less time is needed, when reading, for signal development on the bitlines for signal stored in the cells and propagating from the cells to the bitlines through relatively strong n-channel cell transistors, and less time is needed, during writing, for signal to propagate from the bitlines through the cell transistors to the cells for storage.

Thus, the phase distribution circuit 106 with p-channel tracking transistor 116 and n-channel tracking transistor 117 is configured to adjust the relative durations of the precharge and active phases of the memory cycle in device 100 so as to automatically compensate for skew in the strengths of the p-channel precharge transistors and the n-channel cell transistors relative to a baseline strength ratio. This allows the length of the memory cycle to be reduced, by avoiding the need to accommodate both the worst case precharge phase duration and the worst case active phase duration. The shorter memory cycle can reduce power consumption in the memory device, while also potentially improving power supply operating range and manufacturing yield. As noted above, the baseline strength ratio in the MPN case may be such that the p-channel transistors are stronger than the n-channel transistors, resulting in the MPN precharge phase being 40% of the overall cycle time, and the MPN active phase being 60%.

The memory device 100 as illustrated in FIG. 1 may include other elements in addition to or in place of those specifically shown, including one or more elements of a type commonly found in a conventional implementation of such a memory device. For example, the memory device in a given embodiment may include a row decoder, a column decoder, an input data buffer, an output data buffer and an address buffer, although such elements are not explicitly shown in the figure. Particular ones of the cells 105 can be activated for reading or writing of data by application of appropriate row and column addresses to respective row and column decoders. The input data buffer stores data to be written to the array, while the output data buffer stores data read from the array. The address buffer stores the row and column addresses used in writing data to and reading data from the array. These and numerous other techniques for writing data to and reading data from a memory array such as array 102 are well understood in the art and such techniques will therefore not be described in detail herein.

It should also be understood that the particular arrangement of elements shown in FIG. 1 is presented by way of illustrative example only. More specifically, as previously indicated, the invention can be implemented using many types of memory, and is not limited to any particular memory device configuration. Those skilled in the art will recognize that a wide variety of other memory device configurations may be used in implementing the invention.

By way of example, additional details regarding illustrative memory circuitry and other memory device elements that may be implemented in a given embodiment of the invention may be found in PCT International Application No. PCT/US07/67502, filed Apr. 26, 2007 and entitled "Memory Device with Error Correction Capability and Efficient Partial Word Write Operation," and U.S. patent application Ser. No. 12/161,818, filed Jul. 23, 2008 and entitled "Memory Device with Reduced Buffer Current during Power-Down Mode," both of which are commonly assigned herewith and incorporated by reference herein.

It should also be noted that use of p-channel precharge transistors and n-channel cell transistors in the embodiments described above is by way of illustrative example. In other embodiments, n-channel precharge transistors may be used in conjunction with p-channel cell transistors.

A given memory device configured in accordance with the present invention may be implemented as a stand-alone memory device, for example, a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory implemented within a microprocessor, digital signal processor (DSP), application-specific integrated circuit (ASIC), or other type of processor or integrated circuit device.

Figure 5:
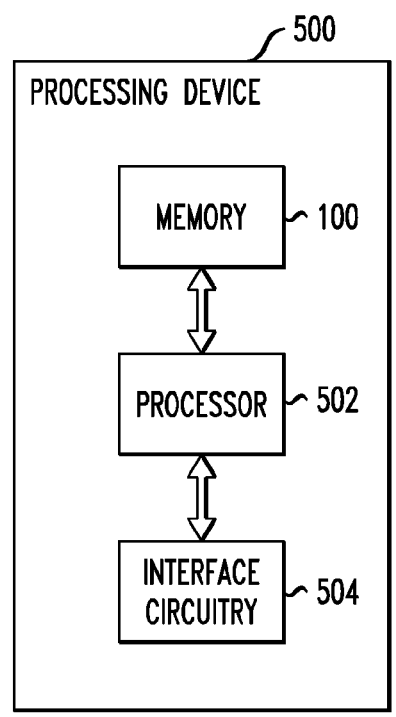
FIG. 5 is a block diagram of a processing device which incorporates the memory device of FIG. 1.

FIG. 5 shows an example of a processing device 500 which incorporates the memory device 100 of FIG. 1. In this embodiment, the memory device 100 is coupled to a processor 502. The processing device further includes interface circuitry 504 coupled to the processor 502. The processing device 500 may comprise, for example, a computer, a server or a portable communication device such as a mobile telephone. Alternatively, processing device 500 may comprise a microprocessor, DSP or ASIC, with processor 502 corresponding to a central processing unit (CPU) and memory device 100 providing at least a portion of an embedded memory of the microprocessor, DSP or ASIC. The interface circuitry 504 may comprise one or more transceivers for allowing the device 500 to communicate over a network.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of memory arrays, phase distribution circuitry, precharge circuitry, memory cell circuitry, transistor conductivity types and other elements for implementing the described functionality. These and numerous other alternative embodiments within the scope of the following claims will be apparent to those skilled in the art.

What is claimed is:

1. A memory device comprising:
   a memory array comprising a plurality of memory cells; and
   a phase distribution circuit coupled to the memory array and operative to control durations of a precharge phase and an active phase of a memory cycle of the memory array based on relative transistor characteristics of a tracked precharge transistor of a first conductivity type and a tracked memory cell transistor of a second conductivity type different than the first conductivity type.

2. The memory device of claim 1 wherein the relative transistor characteristics comprise relative strengths of the tracked precharge and memory cell transistors.

3. The memory device of claim 1 wherein the phase distribution circuit comprises a first tracking transistor of the first conductivity type for tracking the precharge transistor of the first conductivity type and a second tracking transistor of the second conductivity type for tracking the memory cell transistor of the second conductivity type.

4. The memory device of claim 3 wherein the phase distribution circuit further comprises first and second inverters, with an output of the first inverter coupled to an input of the second inverter, and wherein the first and second tracking transistors have their gate terminals coupled to an output of the second inverter and their source or drain terminals coupled to the output of the first inverter, such that the first tracking transistor is operative to oppose a signal transition in a first direction at the output of the first inverter and the second tracking transistor is operative to oppose a signal transition in a second direction at the output of the first inverter.

5. The memory device of claim 4 wherein the first tracking transistor and the tracked precharge transistor comprise p-channel transistors and the second tracking transistor and the tracked memory cell transistor comprise n-channel transistors.

6. The memory device of claim 5 wherein the drain terminals of the first and second tracking transistors are coupled to the output of the first inverter, the source terminal of the first tracking transistor is coupled to a voltage supply terminal and the source terminal of the second tracking transistor is coupled to ground potential.

7. The memory device of claim 4 wherein the phase distribution circuit further comprises an additional inverter having an input coupled to an output of the second inverter, the additional inverter providing a precharge signal to a precharge circuit comprising the tracked precharge transistor.

8. The memory device of claim 4 wherein the phase distribution circuit further comprises an additional inverter having an input coupled to an output of the second inverter, the additional inverter providing a sense amplifier enable signal to a sense amplifier of the memory device.

9. The memory device of claim 4 wherein the phase distribution circuit further comprises an additional inverter having an input coupled to an output of the second inverter, the additional inverter providing a row signal to a wordline associated with the memory cell comprising the tracked memory cell transistor.

10. The memory device of claim 2 wherein if the tracked precharge transistor and the tracked memory cell transistor have a particular predetermined strength ratio, the phase distribution circuit controls the durations of the precharge and active phases of the memory cycle such that said durations have a corresponding predetermined ratio.

11. The memory device of claim 2 wherein if the tracked precharge transistor is stronger than the tracked memory cell transistor, the phase distribution circuit controls the durations of the precharge and active phases of the memory cycle such that the duration of the precharge phase is shorter than the duration of the active phase.

12. The memory device of claim 2 wherein if the tracked precharge transistor is weaker than the tracked memory cell transistor, the phase distribution circuit controls the durations of the precharge and active phases of the memory cycle such that the duration of the precharge phase is longer than the duration of the active phase.

13. An integrated circuit comprising the memory device of claim 1.

14. A processing device comprising the memory device of claim 1.

15. A phase distribution circuit for controlling durations of precharge and active phases of a memory cycle in a memory device, comprising:
   a first tracking transistor of a first conductivity type for tracking a precharge transistor of the memory device;
   a second tracking transistor of a second conductivity type different than the first conductivity type for tracking a memory cell transistor of the memory device; and
   first and second inverters, with an output of the first inverter coupled to an input of the second inverter, and wherein the first and second tracking transistors have their gate terminals coupled to an output of the second inverter and their source or drain terminals coupled to the output of the first inverter, such that the first tracking transistor is operative to oppose a signal transition in a first direction at the output of the first inverter and the second tracking transistor is operative to oppose a signal transition in a second direction at the output of the first inverter;
   wherein the phase distribution circuit is operative to control the durations of the precharge and active phases of the memory cycle based on relative transistor characteristics of the tracked precharge and memory cell transistors.

16. The phase distribution circuit of claim 15 wherein the relative transistor characteristics comprise relative strengths of the tracked precharge and memory cell transistors.

17. A method comprising:
   tracking a characteristic of a precharge transistor of a memory device;
   tracking a characteristic of a memory cell transistor of a memory device; and
   controlling durations of precharge and active phases of a memory cycle of the memory device based on relative characteristics of the tracked precharge and memory cell transistors.

18. The method of claim 17 wherein the controlling step further comprises controlling the durations of the precharge and active phases of the memory cycle such that said durations are approximately equal if the tracked precharge transistor and the tracked memory cell transistor are of approximately equal strength.

19. The method of claim 17 wherein the controlling step further comprises controlling the durations of the precharge and active phases of the memory cycle such that the duration of the precharge phase is shorter than the duration of the active phase if the tracked precharge transistor is stronger than the tracked memory cell transistor.

20. The method of claim 17 wherein the controlling step further comprises controlling the durations of the precharge and active phases of the memory cycle such that the duration of the precharge phase is longer than the duration of the active phase if the tracked precharge transistor is weaker than the tracked memory cell transistor.

* * * * *